US006915476B2

United States Patent
Morino et al.

(10) Patent No.: US 6,915,476 B2
(45) Date of Patent: Jul. 5, 2005

(54) REDUNDANCY SEMICONDUCTOR MEMORY DEVICE WITH ERROR CORRECTION CODE (ECC) CIRCUITS FOR CORRECTING ERRORS IN RECOVERY FUSE DATA

(75) Inventors: Makoto Morino, Tokyo (JP); Masayuki Nakamura, Tokyo (JP)

(73) Assignees: Elpida Memory, Inc., Tokyo (JP); Hitachi ULSI Systems Co. Ltd., Tokyo (JP); Hitachi, Ltd., Tokyo (JP)

( * ) Notice: Subject to any disclaimer, the term of this patent is extended or adjusted under 35 U.S.C. 154(b) by 0 days.

(21) Appl. No.: 11/004,799

(22) Filed: Dec. 7, 2004

(65) Prior Publication Data

US 2005/0122800 A1 Jun. 9, 2005

(30) Foreign Application Priority Data

Dec. 8, 2003  (JP) ....................................... 2003-408863

(51) Int. Cl.[7] ............................................. G11C 29/00
(52) U.S. Cl. .................... 714/768; 714/764; 714/763; 365/230.03; 365/233; 365/200; 365/225.7; 365/230.08
(58) Field of Search ................................ 714/764, 763, 714/768, 774; 365/200, 230.03, 225.7, 233, 226, 189.05, 230.08

(56) References Cited

U.S. PATENT DOCUMENTS 6,085,288 A  *  7/2000  Arimilli et al. .............. 711/118
6,400,292 B1     6/2002  Maeno ........................ 341/101

FOREIGN PATENT DOCUMENTS

JP        60-201599      10/1985    ........... G11C/29/00
JP        2002-094368     3/2002    ......... H03K/19/173

* cited by examiner

*Primary Examiner*—Andrew Q. Tran
(74) *Attorney, Agent, or Firm*—Foley & Lardner LLP

(57) ABSTRACT

A semiconductor integrated circuit device includes a memory array having first to Nth banks, where N is an integer greater than or equal to 2. The memory array further includes a redundancy block having first to Nth column recovery circuit blocks corresponding to the first to Nth banks, first to Nth row recovery circuit blocks corresponding to the first to Nth banks, first to Nth ECC fuse blocks corresponding to the first to Nth banks, and first to Nth ECC circuits corresponding to the first to Nth banks. During initial cycles, the first to Nth ECC circuits correct errors in column recovery fuse data in the first to Nth column recovery circuit blocks and errors in row recovery fuse data in the first to Nth row recovery circuit blocks by using ECC fuse data in the first to Nth ECC fuse blocks, respectively.

7 Claims, 7 Drawing Sheets

US 6,915,476 B2

REDUNDANCY SEMICONDUCTOR MEMORY DEVICE WITH ERROR CORRECTION CODE (ECC) CIRCUITS FOR CORRECTING ERRORS IN RECOVERY FUSE DATA

This application claims priority to prior application JP2003-408883, the disclosure of which is incorporated herein by reference.

BACKGROUND OF THE INVENTION

The present invention relates to a semiconductor integrated circuit device having a memory array and a recovery circuit block for recovering the memory array using recovery fuse data represented by recovery fuse elements after an error of the recovery fuse data is corrected.

Basically, the present invention relates to a semiconductor integrated circuit device having a dynamic random access memory (DRAM) and, in particular, to a synchronous dynamic random access memory (SDRAM).

Japanese Unexamined Patent Application Publication No. 60-201599 (hereinafter referred to as Patent Document 1), in particular, FIG. 3 of this publication discloses a semiconductor integrated circuit device including a memory circuit (fuse circuit) for storing four defective addresses, each having eight bits, a memory circuit (fuse circuit) for storing 5 redundancy bits, and an error correction code (ECC) circuit. In this semiconductor integrated circuit device, the four defective addresses and 5 redundancy bits are supplied to the ECC circuit, which carries out an error correction. The defective addresses indicate addresses of defective memory cells in the memory array and are used to recover the memory array.

Japanese Unexamined Patent Application Publication No. 2002-94368 (hereinafter referred to as Patent Document 2), in particular, FIG. 11 of this publication discloses a semiconductor integrated circuit device in which a plurality of random access memories (RAMS) share an error correction circuit including one group of fuse elements and a cyclic redundancy code.

SUMMARY OF THE INVENTION

At first, description will be made of a semiconductor integrated circuit device of a related art of the present invention with reference to FIG. 1.

As illustrated in FIG. 1, this semiconductor integrated circuit device has a fuse set including a recovery circuit block 11 having a plurality of normal fuses (recovery fuses) FN and an ECC fuse block 12 having a plurality of ECC fuses FE. The semiconductor integrated circuit device further includes a dedicated ECC circuit 13 for each fuse set. With this structure, data error-corrected by the ECC circuit 13 is output via an address comparison circuit 14.

The primary drawbacks of the related art are as follows:

(1) When a recovery address (recovery fuse data) is read out from the recovery circuit block 11, the ECC circuit 13 corrects an error of the recovery address (recovery fuse data) using ECC fuse data in the ECC fuse block 12. Therefore, access of the address is constrained by a time required for the error correction, thus limiting a speed up of the access.

This drawback is caused by the ECC circuit 13 requiring a cyclic encoding of the data using a shift register to carry out error detection and error correction.

(2) Additionally, a small number of the recovery data fuses for the correction increases the number of the ECC fuses.

When the number of data items to be error-corrected is $2^n$, the number of data items required for the error detection is n−1. Accordingly, a small number of data items to be error-corrected results in the increase of the number of ECC fuses.

It is therefore a first object of the present invention to provide a semiconductor integrated circuit device for carrying out error correction by an ECC circuit without constraining external memory access.

It is a second object of the present invention to provide a semiconductor integrated circuit device for carrying out error correction by a small number of ECC circuits without constraining external memory access.

According to the present invention, a semiconductor integrated circuit device has the following structures.

(1) A semiconductor integrated circuit device includes a memory array having first to Nth banks, where N is an integer greater than or equal to 2. The memory array further includes a redundancy block having first to Nth column recovery circuit blocks corresponding to the first to Nth banks, first to Nth row recovery circuit blocks corresponding to the first to Nth banks, first to Nth ECC fuse blocks corresponding to the first to Nth banks, and first to Nth ECC circuits corresponding to the first to Nth banks. During initial cycles started by an input of an initial-cycle start command to the semiconductor integrated circuit device, the first to Nth ECC circuits correct errors in column recovery fuse data in the first to Nth column recovery circuit blocks and errors in row recovery fuse data in the first to Nth row recovery circuit blocks by using ECC fuse data in the first to Nth ECC fuse blocks, respectively.

(2) In the semiconductor integrated circuit device described in (1), the input of the initial-cycle start command to the semiconductor integrated circuit device is carried out by powering on the semiconductor integrated circuit device.

(3) in the semiconductor integrated circuit device described in (2), the semiconductor integrated circuit device includes a double data rate 2 synchronous dynamic random access memory (DDR-2 SDRAM), the initial-cycle start command is an extended mode register set (EMRS) command generated for locking a delayed locked loop (DLL) circuit in the semiconductor integrated circuit device at power-on time, and the initial cycles are 200 cycles starting from an input time of the EMRS command.

(4) In the semiconductor integrated circuit device described in (1), during the initial cycles started by an input of an initial-cycle start command to the semiconductor integrated circuit device, the first to Nth ECC circuits correct errors in column recovery fuse date in the first to Nth column recovery circuit blocks and errors in row recovery fuse data in the first to Nth row recovery circuit blocks by using ECC fuse data in the first to Nth ECC fuse blocks, respectively, and store the error-corrected column recovery fuse data and the error-corrected row recovery fuse data in latch circuits in the first to Nth column recovery circuit blocks and the first to Nth row recovery circuit blocks, respectively.

(5) In the semiconductor integrated circuit device described in (1), the column recovery fuse data in the first to Nth column recovery circuit blocks and the row recovery fuse data in the first to Nth row recovery circuit blocks are programmed by using recovery fuses.

(6) In the semiconductor integrated circuit device described in (1), the ECC fuse data in the first to Nth ECC fuse blocks are programmed by using ECC fuses.

(7) In the semiconductor integrated circuit device described in (1), the column recovery fuse data in the first to Nth column recovery circuit blocks and the row recovery fuse data in the first to Nth row recovery circuit blocks are programmed by using recovery fuses and the ECC fuse data in the first to Nth ECC fuse blocks are programmed by using ECC fuses.

Neither Patent Document 1 nor Patent Document 2 discloses that the overhead occurring in the error correction at an external memory access time can be eliminated by carrying out the correction operation in the ECC circuit only during the initial cycles. In addition, neither Patent Document 1 nor Patent Document 2 refers to a memory array having a plurality of banks and, therefore, neither one discloses that error correction of the row recovery fuse data and column recovery fuse data is carried out by a dedicated ECC circuit for each bank.

As described above, according to the present invention, by carrying out the correction operation in the ECC circuit only during the initial cycles, the overhead occurring in an external memory access can be eliminated.

Furthermore, according to the present invention, by a dedicated ECC circuit carrying out the error correction of row recovery data and column recovery data for each bank of a memory array having a plurality of banks, the reduction in the number of ECC circuits can be achieved and the processing of the ECC circuits and the layout design of the ECC circuits can be facilitated.

DESCRIPTION OF THE PREFERRED EMBODIMENTS

Embodiments of the present invention will be described below with reference to the accompanying drawings.

The features of the present invention are that an operation of error correction is carried out by an ECC circuit during initial cycles, for example, during an initial 200 cycles which is specific for a double data rate (DDR)-2 SDRAM and that error corrections of row recovery data and column recovery data for each bank of a memory array is carried out by a dedicated ECC circuit. In the above-described related art, both a time required for an error correction by an ECC circuit and the size of the ECC circuits become overhead. The present invention can reduce such overhead.

These features of the present invention will be described below with reference to an embodiment.

Figure 1:
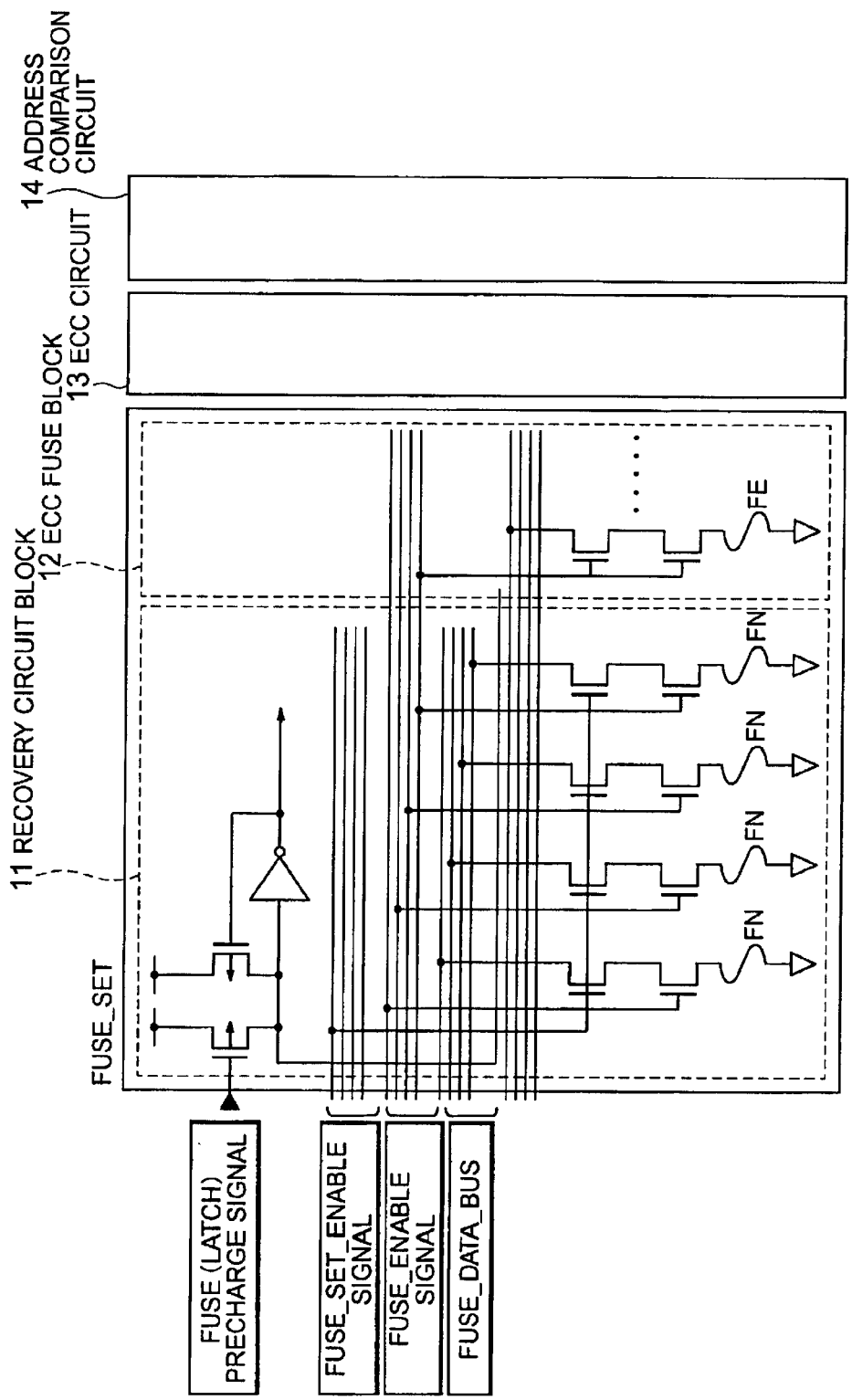
FIG. 1 is a block diagram explaining a semiconductor integrated circuit device of a related art of the present invention.

When, as shown in FIG. 1, recovery fuse data of the recovery circuit block 11 are individually corrected by an ECC circuit 13, the ECC fuse block 12, which programs ECC fuse data, becomes large.

Therefore, according to the present invention, a plurality of recovery fuse data items is completely corrected during the 200 initial cycles. The ratio of the number of fuses that programs ECC fuse data versus the number of fuses that represents recovery fuse data to be corrected is determined as (ECC fuse data):(the data to be corrected)=8:64 in accordance with a layout area in the chip, the constraint of the number of fuses mounted on the chip, and the correction during 200 initial cycles. Further, in order to solve extended correction time caused by the increase in the ECC fuse data, during the 200 initial cycles, which is required to lock a delay locked loop (DLL) circuit in a chip at power-on time, the DDR-2 SDRAM reads out the ECC fuse data and the recovery fuse data, carries out error detection and error correction on the data, and stores the error-corrected data in a latch circuit located in a recovery circuit block. Thus, a program error, such as a cutting defect in fuses constituting the recovery data, can be recovered.

Figure 2:
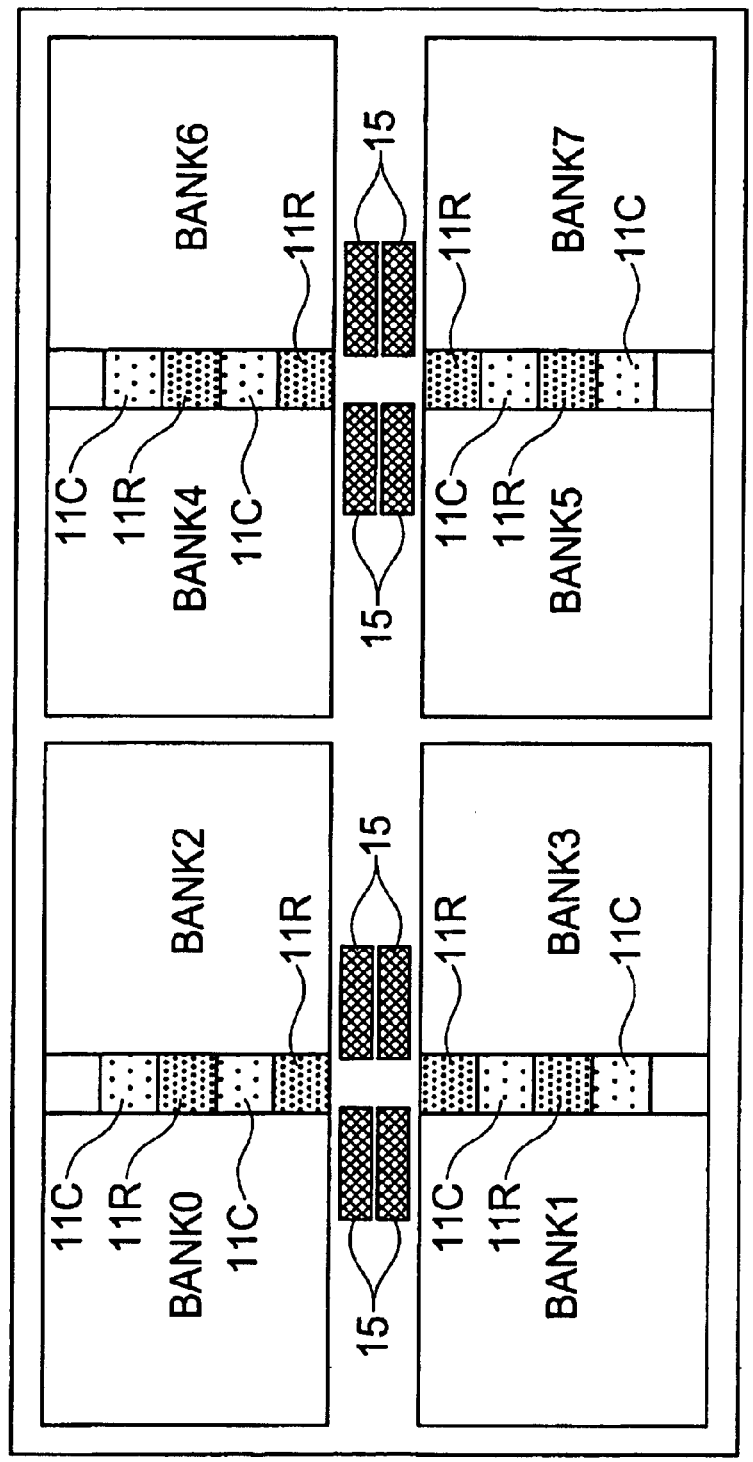
FIG. 2 is a block diagram of a semiconductor integrated circuit device according to an embodiment of the present invention.

FIG. 2 shows a semiconductor integrated circuit device according to an embodiment of the present invention. This semiconductor integrated circuit device comprises a memory array having a plurality of banks bank0, . . . , and bank7. The memory array further includes a redundancy block having a plurality of column recovery circuit blocks 11C corresponding to each of the banks, i.e., bank0, . . . , and bank7; a plurality of row recovery circuit blocks 11R corresponding to each of the banks, i.e., bank0, . . . , and bank7; and a plurality of ECC blocks 15 corresponding to each of the banks, i.e., bank0, . . . , and bank7. Each ECC block 15 includes an ECC fuse block and an ECC circuit, both of which will be described below.

Thus, eight of the column recovery circuit blocks 11C, eight of the row recovery circuit blocks 11R, and eight of the ECC blocks 15 are provided corresponding to the banks, i.e., bank0, . . . , and bank7 in the semiconductor chip.

Figure 3:
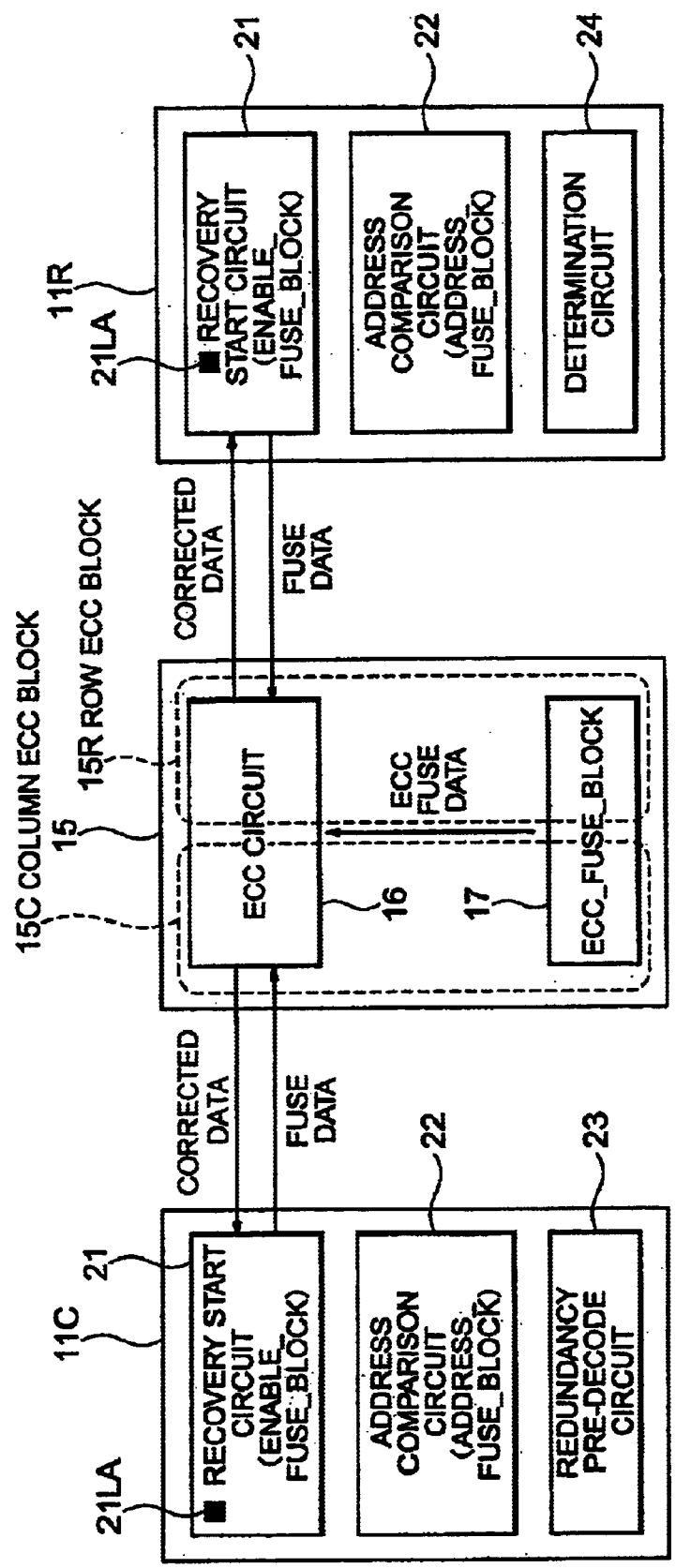
FIG. 3 is a block diagram of internal configurations of a column recovery circuit block, a row recovery circuit block, and an ECC block corresponding to one bank shown in FIG. 2.

FIG. 3 shows internal configurations of the column recovery circuit block 11C, the row recovery circuit block 11R, and the ECC block 15 for one bank shown in FIG. 2. An internal configuration of the column recovery circuit block 11C, the row recovery circuit block 11R, and the ECC block 15 for another bank is the same as that in FIG. 3. The interior of the ECC block 15 is divided into a column ECC block 15C corresponding to the column recovery circuit block 11C and a row ECC block 15R corresponding to the row recovery circuit block 11R.

As shown in FIG. 3, the column recovery circuit block 11C includes a recovery start circuit (Enable Fuse block) 21, an address comparison circuit (Address Fuse block) 22, and a redundancy pre-decode circuit 23. The row recovery circuit block 11R includes another recovery start circuit (Enable Fuse block) 21, another address comparison circuit (Address Fuse block) 22, and a determination circuit 24. The ECC block 15 includes an ECC circuit 16 and an ECC fuse block 17. In the ECC fuse block 17, error detection and correction data is programmed as ECC fuse data in advance. The ECC circuit 16 functions as the column ECC block 15C and the row ECC block 15R.

Recovery data (recovery fuse data) programmed in fuses of the recovery start circuits 21 in the column recovery circuit black 11C and the row recovery circuit block 11R is composed of 64-bit units. Each unit includes 4 fuse sets, each fuse set being 16 bits. The recovery data is read out by the column ECC block 15C and the row ECC block 15R of the ECC circuit 16 in the ECC block 15. The number of address fuses for a column is different from the numbers of address fuses for a row. Accordingly, if data of one fuse set is less than or equal to 16 bits, extra bits are filled with "0". The error detection and correction fuse data for the ECC fuses is then created. Concurrently, ECC fuse data of the ECC fuse block 17 in the ECC block 15 is read out by the column ECC block 15C and the row ECC block 15R of the ECC circuit 16 in the ECC block 15. The ECC circuit 16 then carries out an error detection and correction operation on the data. The data after the error correction (corrected data) are transferred to the column recovery circuit block 11C and the row recovery circuit block 11R. The corrected data are held by latch circuits 21LA in the recovery start circuits 21.

Figure 4:
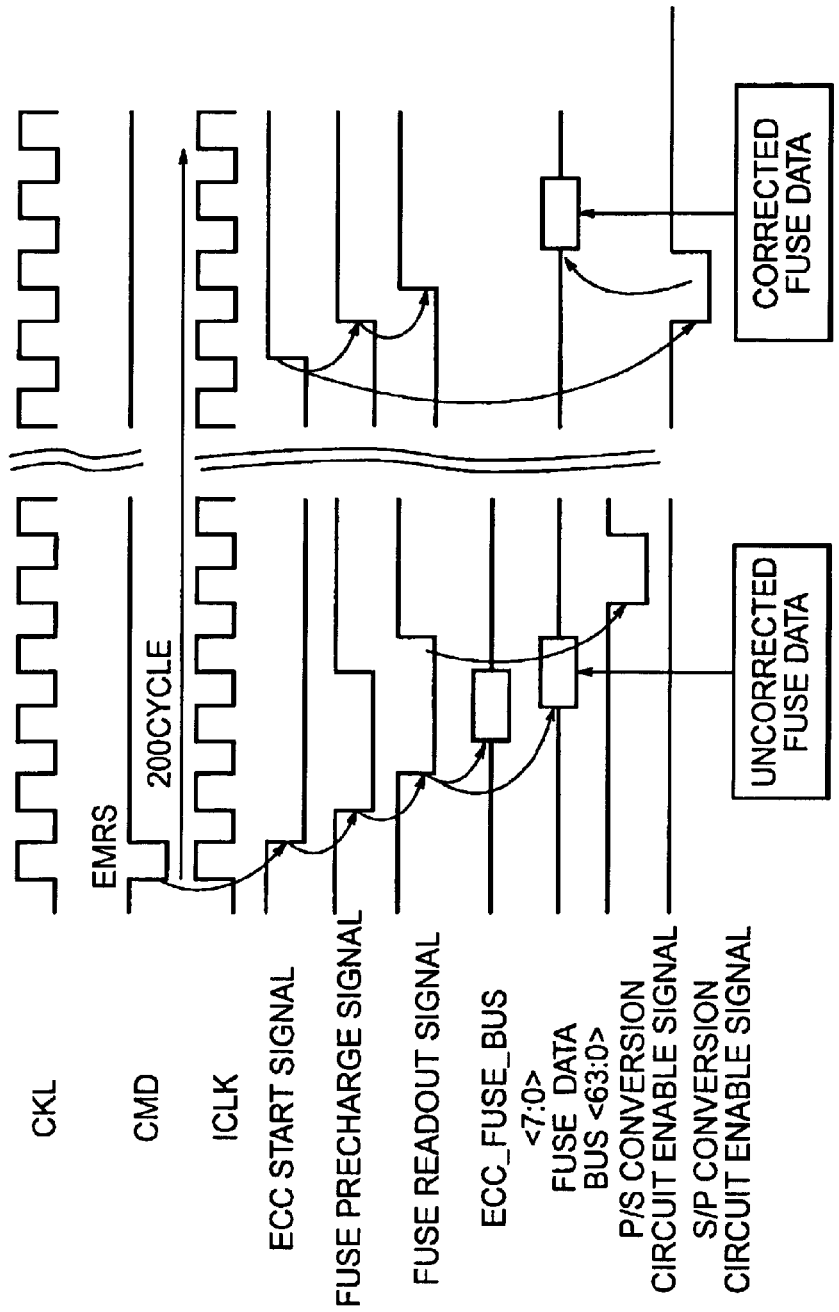
FIG. 4 is a diagram illustrating a start timing and a fuse data transfer timing of the ECC circuit by recovery start circuits in a column recovery circuit block and a row recovery circuit block shown in FIG. 3.

FIG. 4 shows a start timing and a fuse data transfer timing of the ECC circuit 16 by the recovery start circuit 21 in the column recovery circuit block 11C or the row recovery circuit block 11R shown in FIG. 3. Since a DDR-2 SDRAM locks an internal DLL circuit at power-n time, 200 initial cycles are required after an extended mode register set (EMRS) command is input. By inputting the EMRS command for starting the initial cycles as a command CMD, an ECC start signal is enabled. Then, the column and row recovery fuses, an ECC fuse precharge signal, and a fuse readout signal are sequentially enabled. The ECC fuse data, which is 8-bit parallel data for error detection and correction, is read out by the ECC circuit 16 via an ECC fuse bus 170 in the ECC fuse block 17 shown in FIG. 5. From the column recovery circuit block 11C and the row recovery circuit block 11R, the 64-bit recovery data (recovery fuse data) are read out by the ECC circuit 16 via Fuse Data buses 210 in the recovery start circuits 21 shown in FIG. 6.

Figure 7:
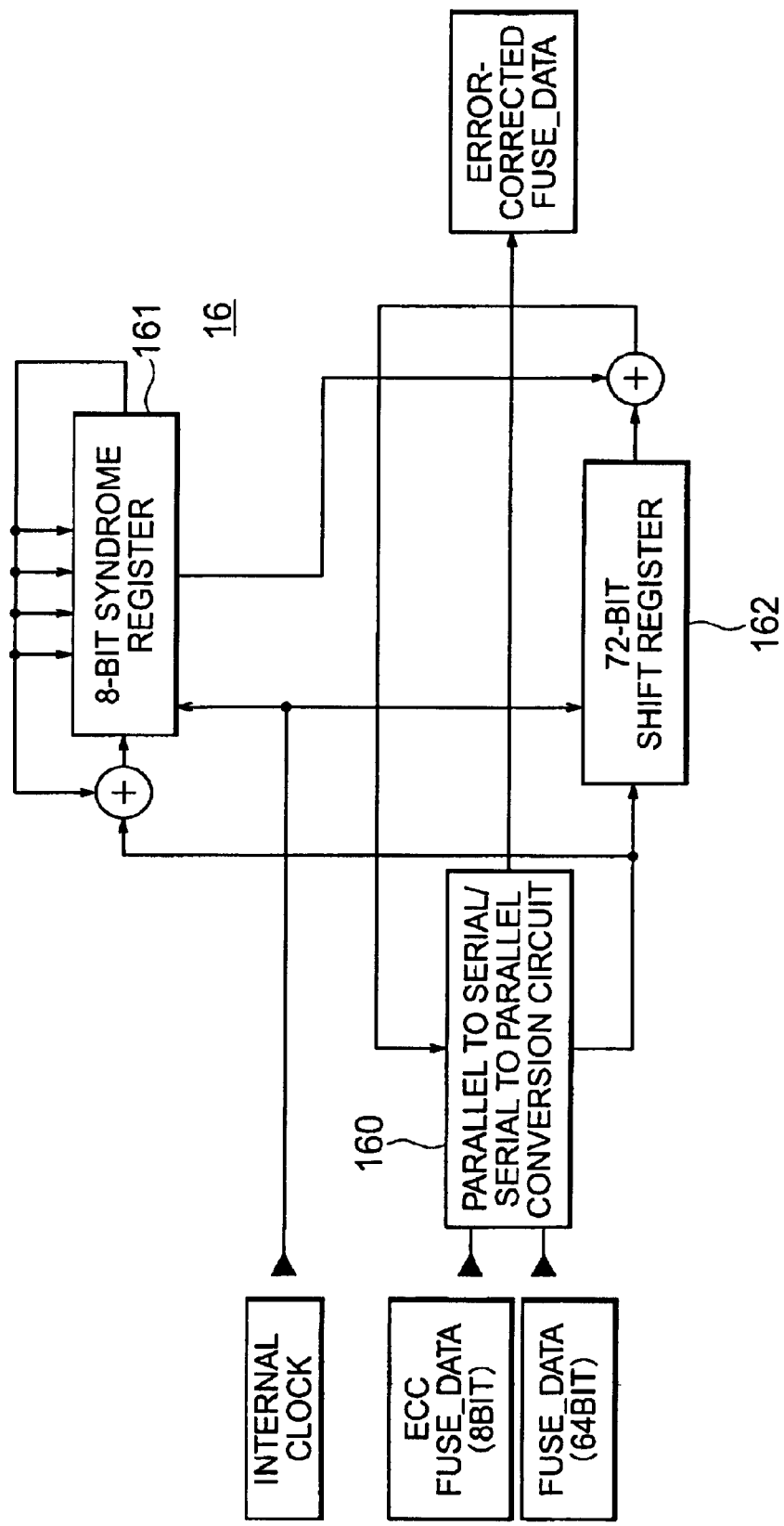
FIG. 7 is a block diagram of an ECC circuit shown in FIG. 3.

FIG. 7 shows a detailed configuration of the ECC circuit 16 shown in FIG. 3. As shown in FIG. 7, by enabling a parallel to serial conversion enable signal, a parallel to serial & serial to parallel conversion circuit 160 converts the 8-bit data for error detection and correction, which are simultaneously read out in parallel from the ECC fuses, and recovery data (recovery fuse data) read out in parallel from the column recovery circuit block. 11C and the row recovery circuit block 11R to serial data. The converted data are transferred to an 8-bit syndrome register 161 and a 72-bit shift register 162, where error detection and correction is carried out Upon completion of the correction, the data is transferred to the parallel to serial & serial to parallel conversion circuit 160, which converts the data to parallel data by enabling a serial to parallel conversion enable signal. The error-corrected data is transferred to the column and row recovery start circuits 21 and is held by latch circuits 21LA in the recovery start circuits 21.

Subsequently, the operation of the present embodiment will be described.

As shown in FIG. 3, recovery fuse data programmed in fuses in the column recovery circuit block 11C and the row recovery circuit block 11R is read out by the ECC circuit 16 during 200 initial cycles. The ECC circuit 16 carries out error detection and correction by using correction data programmed in the ECC fuse block 17 in advance. The data after the error correction (corrected data) is transferred to the column recovery circuit block 11C and the row recovery circuit block 11R from the ECC circuit 16 and is held by the latch circuits 21LA in the recovery start circuits 21.

As shown in FIG. 4, the ECC start signal is enabled by the extended mode register set (EMRS). This enables fuse precharge signals for a row, a column, and an ECC and, in turn, a fuse readout signal.

Figure 5:
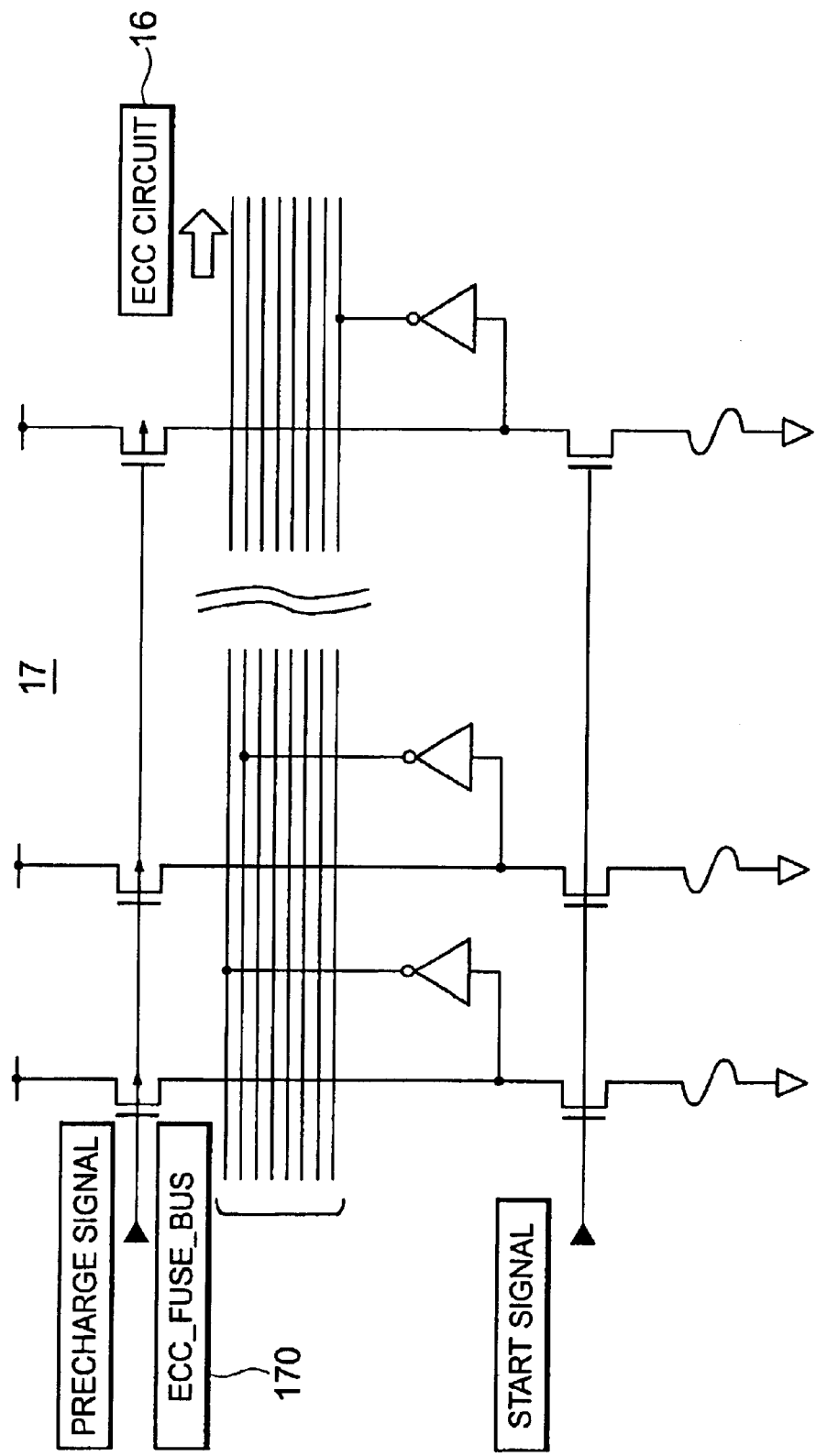
FIG. 5 is a circuit diagram of an ECC fuse block shown in FIG. 3.

FIG. 5 shows an example of the ECC fuse block 17. Upon receipt of the precharge signal and the start signal for reading out fuse data, the ECC fuse block 17 reads out ECC fuse data programmed in advance onto the ECC fuse bus 170 and transfers them to the ECC circuit 16.

Figure 6:
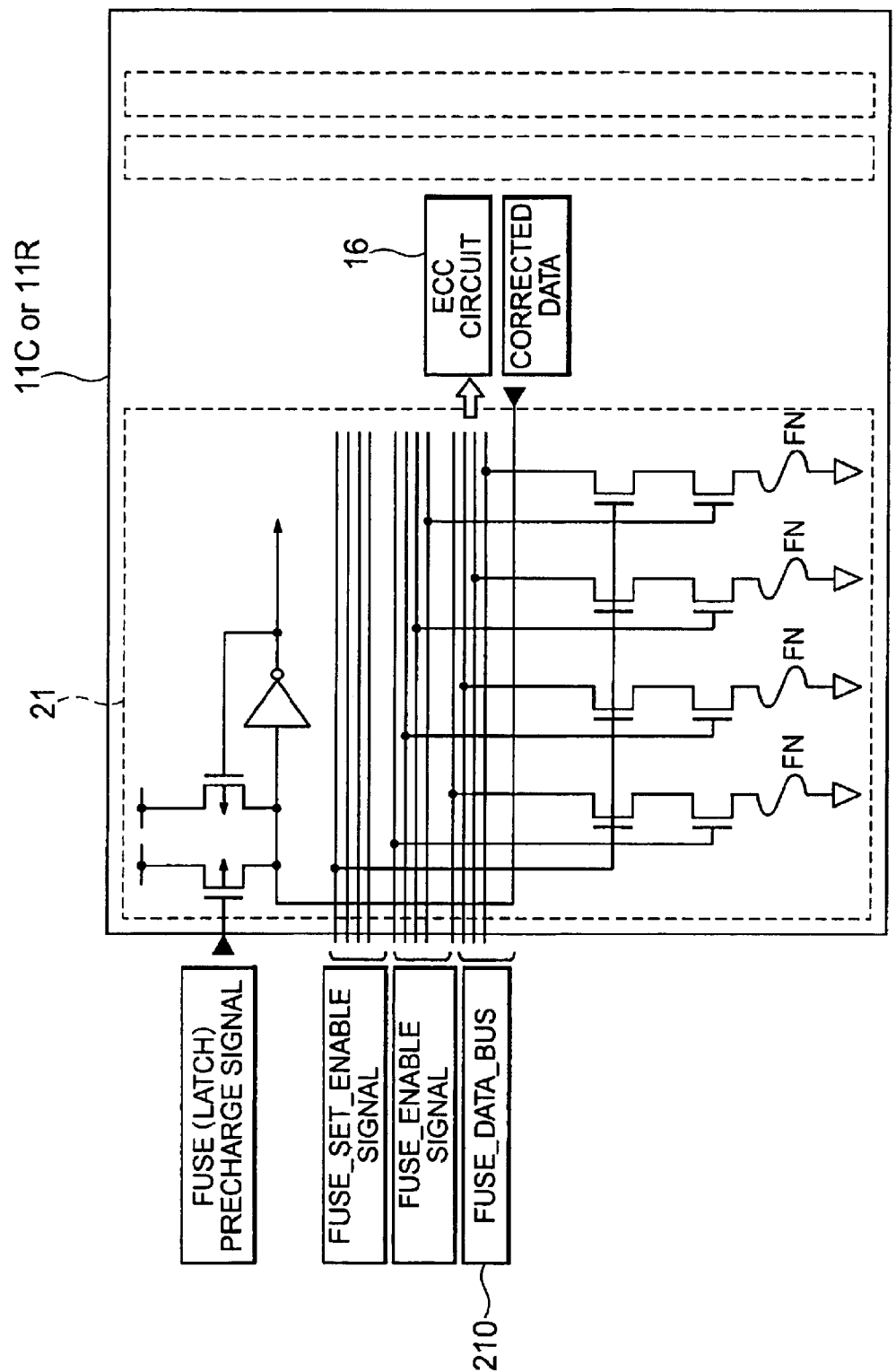
FIG. 6 is a circuit diagram of a recovery start circuit shown in FIG. 3.

FIG. 6 shows an example of the recovery start circuit 21 used in the column recovery circuit block 11C and the row recovery circuit block 11R. The fuse latch circuit 21LA in the recovery start circuits 21 is precharged by a fuse (latch) precharge signal enabled by the ECC start signal. By enabling the fuse readout signal, a Fuse set Enable signal and a Fuse Enable signal in the recovery start circuits 21 are enabled, and therefore, the recovery fuse data is transferred to the ECC circuit 16 via a Fuse data bus 210.

Referring back to FIG. 7, an example of the ECC circuit 16 is illustrated. Fuse data transferred from the column recovery circuit block 11C and the row recovery circuit block 11R are transferred to a 72-bit shift register 12 in a serial format via a parallel to serial conversion circuit 160. Similarly, ECC fuse date output from the ECC fuse block 17 is transferred to an 8-bit syndrome register 161 and the above-described shift register 162 in a serial format via a parallel to serial conversion circuit 160. The fuse data corrected by the syndrome register 161 and the shift register 162 are converted to a series of 4-bit parallel data by a serial to parallel conversion circuit 160 and are transferred to the recovery start circuits 21. The corrected data are then held by the latch circuits 21LA.

According to the present invention, in order to prevent a faulty operation, the above-described readout operation and error correction is carried out for fuse data for 8 banks in one chip by an ECC circuit arranged for each bank at the same time. In addition, the correction of the recovery fuse data is carried out during the initial 200 cycles starting from the EMRS, which is specific to a DDR-2 SDRAM. Thus, the present invention provides the reduction in the number of circuits in an ECC circuit, and facilitates the configuration of the circuit and its layout by processing for each bank. Furthermore, the present invention provides an efficient recovery circuit by carrying out the correction in the ECC circuit during the initial cycles to eliminate overhead occurring in error correction and external memory access.

As described above, in the present embodiment, even when a fuse programming error occurs due to a cutting defect of a fuse, the 2-bit error out of 64-bit data can be detected or the 1-bit error out of 64-bit data can be corrected.

Additionally, by arranging an ECC fuse block and an ECC circuit for a column recovery circuit block and a row recovery circuit block, the layout area can be reduced.

According to another embodiment of the present invention, the error correction function provided by the ECC circuit is applied not only to the recovery circuit block, but also to fuses for an internal power supply trimming, thus allowing a cutting error of the trimming fuses to be recovered.

Furthermore, if an ECC fuse in the ECC fuse block has the same structure as that used in the recovery circuit block, a cutting defect may occur in the ECC fuse. In order to solve this problem, a fuse capable of electrically rewriting data, for example, a FLASH memory and an electrically erasable programmable read only memory (EEPROM) may be used.

While the present invention has thus far been disclosed in conjunction with several embodiments thereof, it will be readily possible for those skilled in the art to put the present invention into practice in various other manners.

What is claimed is:

1. A semiconductor integrated circuit device including a memory array having first to Nth banks, where N being an integer greater than or equal to 2, the memory array further including a redundancy block comprising:

first to Nth column recovery circuit blocks corresponding to the first to Nth banks;

first to Nth row recovery circuit blocks corresponding to the first to Nth banks;

first to Nth ECC fuse blocks corresponding to the first to Nth banks; and first to Nth ECC circuits corresponding to the first to Nth banks;

wherein, during initial cycles started by an input of an initial-cycle start command to the semiconductor integrated circuit device, the first to Nth ECC circuits correct errors in column recovery fuse data in the first to Nth column recovery circuit blocks and row recovery fuse data in the first to Nth row recovery circuit blocks by using ECC fuse data in the first to Nth ECC fuse blocks, respectively.

2. The semiconductor integrated circuit device according to claim 1, wherein:

the input of the initial-cycle start command to the semiconductor integrated circuit device is carried out by powering on the semiconductor integrated circuit device.

3. The semiconductor integrated circuit device according to claim 2, wherein:

the semiconductor integrated circuit device comprises a double data rate-2 synchronous dynamic random access memory (DDR-2 SDRAM), the initial-cycle start command is an extended mode register set (EMRS) command generated for locking a delayed locked loop (DLL) circuit in the semiconductor integrated circuit device at power-on time, and the initial cycles are 200 cycles starting from an input time of the EMRS command.

4. The semiconductor integrated circuit device according to claim 1, wherein:

during the initial cycles started by an input of an initial-cycle start command to the semiconductor integrated circuit device, the first to Nth ECC circuits correct errors in column recovery fuse data in the first to Nth column recovery circuit blocks and errors in row recovery fuse data in the first to Nth row recovery circuit blocks by using ECC fuse data in the first to Nth ECC fuse blocks, respectively, and store the error-corrected column recovery fuse data and the error-corrected row recovery fuse data in latch circuits in the first to Nth column recovery circuit blocks and the first to Nth row recovery circuit blocks, respectively.

5. The semiconductor integrated circuit device according to claim 1, wherein:

the column recovery fuse data in the first to Nth column recovery circuit blocks and the row recovery fuse data in the first to Nth row recovery circuit blocks are programmed by using recovery fuses.

6. The semiconductor integrated circuit device according to claim 1, wherein:

the ECC fuse data in the first to Nth ECC fuse blocks are programmed by using ECC fuses.

7. The semiconductor integrated circuit device according to claim 1, wherein:

the column recovery fuse data in the first to Nth column recovery circuit blocks and the row recovery fuse data in the first to Nth row recovery circuit blocks are programmed by using recovery fuses and the ECC fuse data in the first to Nth ECC fuse blocks are programmed by using ECC fuses.

* * * * *